United States Patent
Smith et al.

(10) Patent No.: US 9,997,388 B2
(45) Date of Patent: Jun. 12, 2018

(54) SUBSTRATE CONTAINER WITH PURGE PORTS

(71) Applicant: ENTEGRIS, INC., Billerica, MA (US)

(72) Inventors: Mark V. Smith, Colorado Springs, CO (US); John Burns, Colorado Springs, CO (US)

(73) Assignee: ENTEGRIS, INC., Billerica, MA (US)

( * ) Notice: Subject to any disclaimer, the term of this patent is extended or adjusted under 35 U.S.C. 154(b) by 275 days.

(21) Appl. No.: 14/646,285

(22) PCT Filed: Nov. 20, 2013

(86) PCT No.: PCT/US2013/070999
§ 371 (c)(1),
(2) Date: May 20, 2015

(87) PCT Pub. No.: WO2014/081825
PCT Pub. Date: May 30, 2014

(65) Prior Publication Data
US 2015/0294889 A1    Oct. 15, 2015

Related U.S. Application Data

(60) Provisional application No. 61/728,644, filed on Nov. 20, 2012, provisional application No. 61/734,066, filed on Dec. 6, 2012.

(51) Int. Cl.
*B65D 85/90* (2006.01)
*H01L 21/673* (2006.01)
*B65D 85/38* (2006.01)

(52) U.S. Cl.
CPC ........ *H01L 21/67393* (2013.01); *B65D 85/38* (2013.01)

(58) Field of Classification Search
CPC ......... B65D 85/38; B65D 85/90; B65D 81/05
(Continued)

(56) References Cited

U.S. PATENT DOCUMENTS 5,988,233 A    11/1999   Fosnight et al.
6,164,664 A    12/2000   Fosnight et al.
(Continued)

FOREIGN PATENT DOCUMENTS

JP    2004-179449 A    6/2004
JP     2007-5599 A     1/2007
(Continued)

*Primary Examiner* — King M Chu

(57) ABSTRACT

A breather assembly mounted to the purge port of a substrate carrier for coupling with a tool port. In various embodiments, the breather assembly comprises a grommet that presents either a planar or a concave mounting face for coupling to the tool port. In one embodiment, the grommet is of a "solid compliant" construction, wherein the mounting face complies with the mouth of the tool port without substantially changing shape. In other embodiments, the grommet is of a "flexible compliant" construction, wherein the grommet changes shape when engaged with the tool port. The grommet can be configured so that the force (pressure-area product) exerted in the direction towards the tool port is greater than the force exerted in the direction away from the tool port, thereby enhancing the seal between the grommet and the tool port.

20 Claims, 7 Drawing Sheets

(58) Field of Classification Search
USPC .................. 206/701, 710, 711, 723; 220/202
See application file for complete search history.

(56) References Cited

U.S. PATENT DOCUMENTS

| | | | |
|---|---|---|---|
| 6,221,163 B1 | 4/2001 | Roberson, Jr. et al. | |
| 6,319,297 B1 | 11/2001 | Fosnight | |
| 7,073,667 B2* | 7/2006 | Burns | B65D 79/02 |
| | | | 206/454 |
| 8,141,712 B2* | 3/2012 | Wiseman | H01L 21/6732 |
| | | | 206/710 |
| 8,146,623 B2 | 4/2012 | Tieben et al. | |
| 8,235,218 B2* | 8/2012 | Chiu | F16J 15/46 |
| | | | 206/710 |
| 8,397,917 B2* | 3/2013 | Kasama | H01L 21/67309 |
| | | | 206/308.1 |
| 8,413,815 B2* | 4/2013 | Ku | H01L 21/67369 |
| | | | 206/710 |
| 8,505,732 B2* | 8/2013 | Lu | H01L 21/67369 |
| | | | 206/454 |
| 8,522,836 B2* | 9/2013 | Okabe | H01L 21/67393 |
| | | | 141/286 |
| 2003/0047562 A1 | 3/2003 | Wu et al. | |
| 2005/0003600 A1 | 1/2005 | Kasai et al. | |
| 2005/0077204 A1 | 4/2005 | Sumi et al. | |
| 2008/0121560 A1 | 5/2008 | Tieben et al. | |
| 2009/0266441 A1 | 10/2009 | Sato | |
| 2010/0163452 A1 | 7/2010 | Lin et al. | |

FOREIGN PATENT DOCUMENTS

| | | |
|---|---|---|
| JP | 2009-277687 A | 11/2009 |
| JP | 2011-187539 A | 9/2011 |
| TW | M413660 U | 10/2011 |
| WO | 2014/081825 A1 | 5/2014 |

* cited by examiner

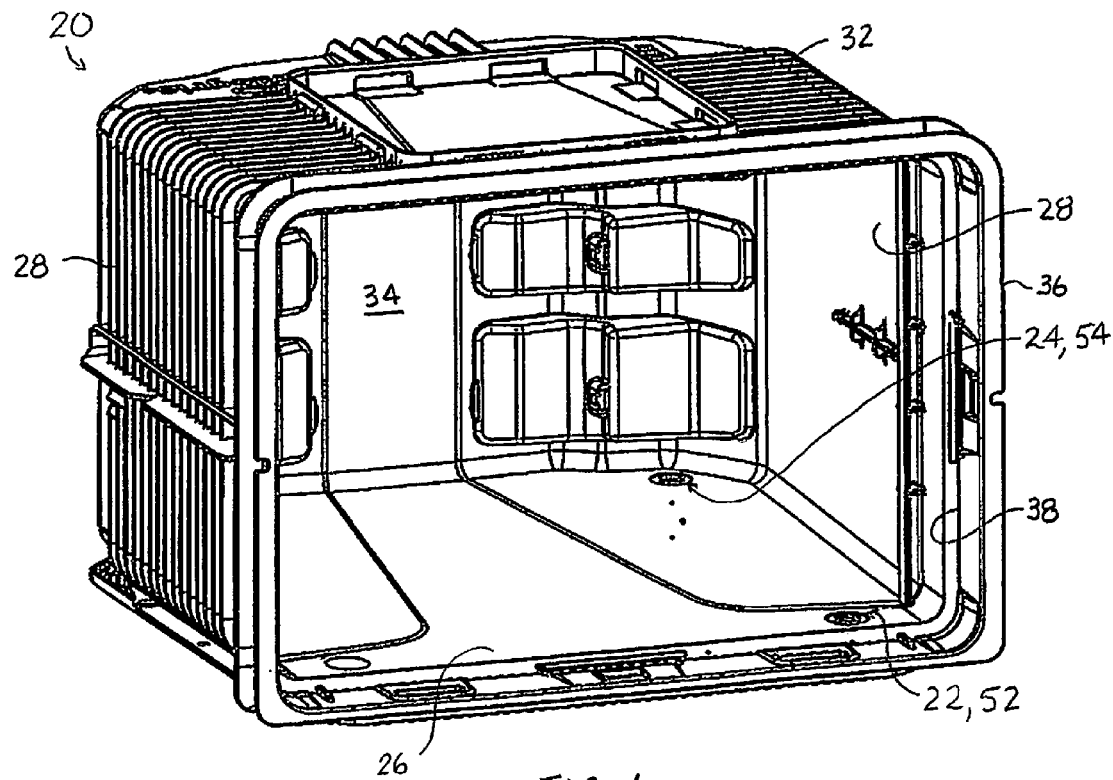
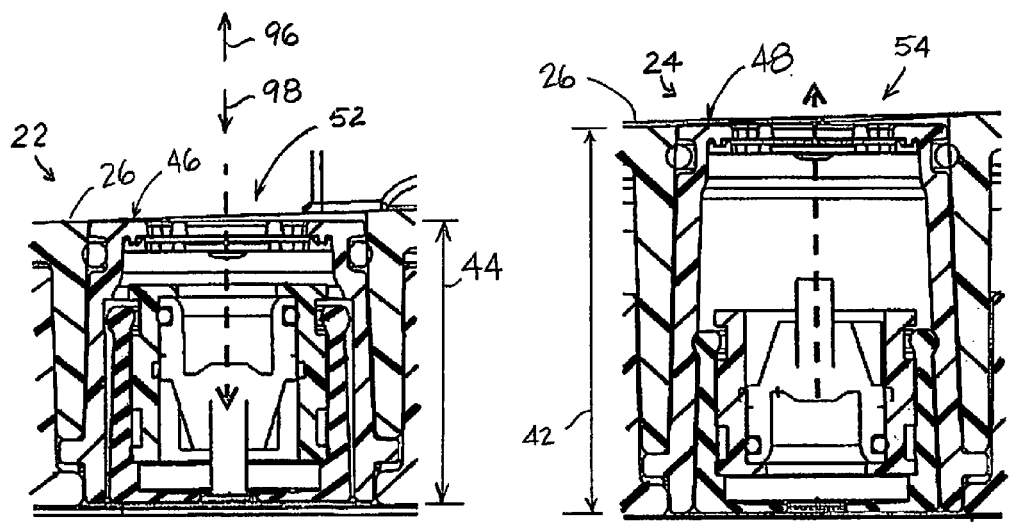
FIG. 1
FIG. 2
FIG. 3

SUBSTRATE CONTAINER WITH PURGE PORTS

RELATED APPLICATIONS

This present application is a National Phase entry of PCT Application No. PCT/US2013/070999, filed Nov. 20, 2013, which claims priority to U.S. Provisional Patent Application No. 61/728,644, filed Nov. 20, 2012, and U.S. Provisional Patent Application No. 61/734,066, filed Dec. 6, 2012, the disclosures of which are incorporated by reference herein in their entirety.

FIELD OF THE DISCLOSURE

The present disclosure relates generally to carriers for the handling of wafers or substrates, and more specifically to purge ports for intake and exhaust of gases therefrom.

BACKGROUND

Various substrate containers, such as wafer carriers, utilize purge ports for exhaust and intake of gases. Certain substrate containers must interface with tool ports having a source and/or vacuum ports for charging and discharging, respectively, the gas from the wafer container. Pneumatic coupling between the purge ports of the substrate container and the tool ports are typically effected by a contact seal that relies on the weight of the container to maintain contact.

Processing equipment for semiconductors typically utilize kinematic couplings to engage and properly orient substrate containers for the handling of the substrates. The kinematic couplings also typically rely on the weight of the container to maintain engagement. It has been found that the contact between the purge ports of the container and the tool ports can partially counter the weight of the container, particularly when the container is empty or only partially loaded with substrates. The problem is exacerbated when the substrate container is pressurized by the introduction of the purge gas flow. The countering of the weight can cause the substrate container to partially lift off the kinematic couplings, resulting in misalignment with substrate handling equipment, as well as a breach in the contact seal between the purge ports and the tool ports.

Further development of reliable ways to mate the purge ports of substrate containers with the tool ports of existing equipment without interfering with the alignment of the substrate container to processing equipment would be welcomed.

SUMMARY

Various embodiments of the disclosure utilize purge ports having an interface made of compliant materials that conform to the interface of the tool port, to provide a seal between the substrate container and the tool port. In certain embodiments, the construction of a compliant member of the purge port interface is of a "solid compliant" construction, wherein the general shape of the compliant member is substantially maintained under load, but is deformed locally (i.e., "indented") to accommodate the shape of the tool port. In other embodiments, the compliant member is of a "flexible compliant" member, wherein the general shape of the compliant member is altered substantially during contact with the tool port to effect the seal. Various embodiments of the disclosure are tailored to reduce the force that the compliant member exerts the tool port to enable the kinematic couplings of the substrate carrier to engage normally.

Structurally, various disclosed embodiments comprise a substrate container that defines an interior chamber, the substrate container including a port for passage of a purge gas into or out of the interior chamber. A breather assembly is disposed in the port, the breather assembly including a body and a grommet disposed in the body. In one embodiment, the grommet includes a tubular portion and an annular disk portion, the tubular portion having an inner diameter at a distal end, the annular disk portion extending radially inward from the tubular portion and being proximate the distal end of the tubular portion, the annular disk portion defining a central aperture having an inner diameter. The inner diameter of the aperture is less than the inner diameter of the distal end of the tubular portion, the annular disk portion presenting a distal face of the grommet. The distal face of the grommet presents one of a planar geometry and a concave geometry, the distal face being adapted to contact a tool port that has an inner diameter that is greater than the inner diameter of the aperture and less than the inner diameter of the distal end of the tubular portion. The annular disk portion of the grommet is of a compliant material for formation of a seal between the tool port and the distal face of the grommet.

In other embodiments, a substrate container that defines an interior chamber is disclosed, the substrate container comprising a port for passage of a purge gas into or out of the interior chamber. A breather assembly disposed in the port, the breather assembly including a body and a grommet disposed in the body. In one embodiment, the grommet includes a tubular portion and an annular disk portion, the tubular portion having an inner diameter at a distal end, the annular disk portion extending radially inward from the tubular portion and being proximate the distal end of the tubular portion, the annular disk portion defining a central aperture having an inner diameter, the inner diameter of the central aperture being less than the inner diameter of the distal end of the tubular portion, the grommet including an orifice structure that surrounds the central aperture and depends from the annular disk portion, the orifice structure having a proximal end and a distal end, the proximal end of the orifice structure being integral with the annular disk portion, the grommet including a second annular disk that extends radially outward from the distal end of the orifice structure, the second annular disk portion presenting a distal face of the grommet. The distal face of the grommet defines one of a planar geometry and a concave geometry, the distal face being adapted to contact a tool port that has an inner diameter that is greater than the inner diameter of the central aperture and less than the inner diameter of the distal end of the tubular portion. The annular disk portion of the grommet is of a compliant material for formation of a seal between the tool port and the distal face of the grommet.

The body can include an interior surface and structure defining an undercut on the interior surface. The grommet can includes one of a rib and a lip dimensioned and positioned to mate with the undercut when the grommet is disposed in the body. In one embodiment, the tubular portion of the grommet comprises a bellows.

Some embodiments of the disclosure further comprise a check valve and a check valve housing disposed in the grommet, an interior ledge portion on the grommet for registration of the check valve to separate the check valve from the annular disk portion. In one embodiment, the check valve housing is coupled directly to the body of the breather assembly.

Various embodiments disclose a breather assembly, comprising a support structure adapted for insertion into a purge port of a substrate container, the support structure defining an inner diameter. An annular disk is coupled with the support structure proximate the inner diameter, the annular disk including a proximal face and a distal face and including structure that defines a central aperture having a diameter. The distal face of the annular disk presents one of a planar geometry and a concave geometry, the distal face being adapted to contact a tool port that has an inner diameter that is greater than the diameter of the aperture and less than the inner diameter of the support structure.

The support structure can include a tubular portion. The tubular portion can comprise a resilient material. The annular disk can comprise a compliant material for formation of a seal between the tool port and the distal face of the grommet. In one embodiment, the annular disk is an overmolded component; in other embodiments, the support structure and the annular disk are an integrally formed component.

In other embodiments, a method for purging a substrate container is disclosed, the method comprising providing a tool port for supply of a purge gas, the tool port including a mouth, and providing a substrate container having a purge port, the purge port including an annular disk suspended therein, the annular disk being concentric about a central axis and adapted to engage the mouth of the tool port. The method can further comprise translating the substrate carrier in a first direction that is parallel to the central axis, thereby bringing the annular disk into an initial contact with the mouth of the tool port, and causing the annular disk to stretch over the mouth of the tool port as the annular disk is further translated in the first direction beyond the initial contact.

BRIEF DESCRIPTION OF THE DRAWINGS

FIG. 1 is a perspective view of a wafer carrier having front and rear purge ports in an embodiment of the disclosure;

FIGS. 2 and 3 are cutaway sectional views of a front and a rear purge port of the wafer carrier of FIG. 1 in embodiments of the disclosure;

DETAILED DESCRIPTION

Figure 5:
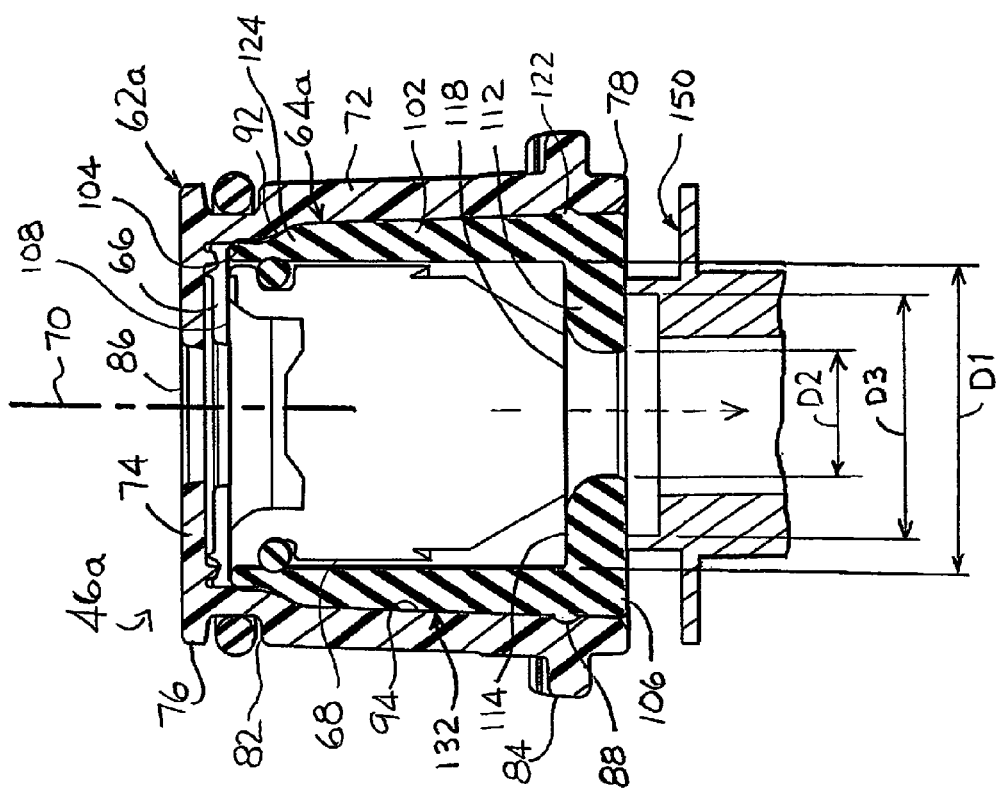
FIGS. 4 and 5 are sectional views of a breather assembly for a front exhaust and a front inlet valve, respectively, and a tool port, utilizing a solid compliant construction in embodiments of the disclosure.

Referring to FIG. 1, a substrate container 20 such as a wafer carrier implementing a front port 22 and a rear port 24 is depicted in an embodiment of the disclosure. The substrate container 20 includes a floor structure 26, side portions 28, and a top portion 32, all of which extend in one direction to a rear wall 34 and in an opposite direction to a door frame 36, the door frame 36 defining an opening 38. The front and rear ports 22 and 24 are so named because of the locations relative to the opening 38 of the substrate container 20, with the front port 22 being nearest the opening 38 and the rear port 24 being furthest from the opening 38.

Referring to FIGS. 2 and 3, the front port 22 and the rear port 24 are depicted in detail in an embodiment of the disclosure. In the depicted embodiment, the thickness of the floor structure 26 is greater at the rear port 24 than at the front port 22, causing an axial dimension 42 of the rear port 24 to be of a greater than an axial dimension 44 of the front port 22. In the depicted embodiment, the front and rear ports 22 and 24 are fitted with outlet and inlet breather assemblies 46 and 48, respectively. The rear port 24 is configured as an inlet port 54, with the breather assembly 48 arranged to enable gas to flow outward from the interior of the substrate container 20. Accordingly, in the depicted embodiment, the front port 22 functions as an outlet port 52 and the rear port 24 functions as an inlet port 54. Whether a respective one of the front and rear ports 22, 24 function as an inlet port or an outlet port is non-limiting. That is, the front port 22 can be configured as an inlet port and/or the rear port 24 as an outlet port.

Figure 4:
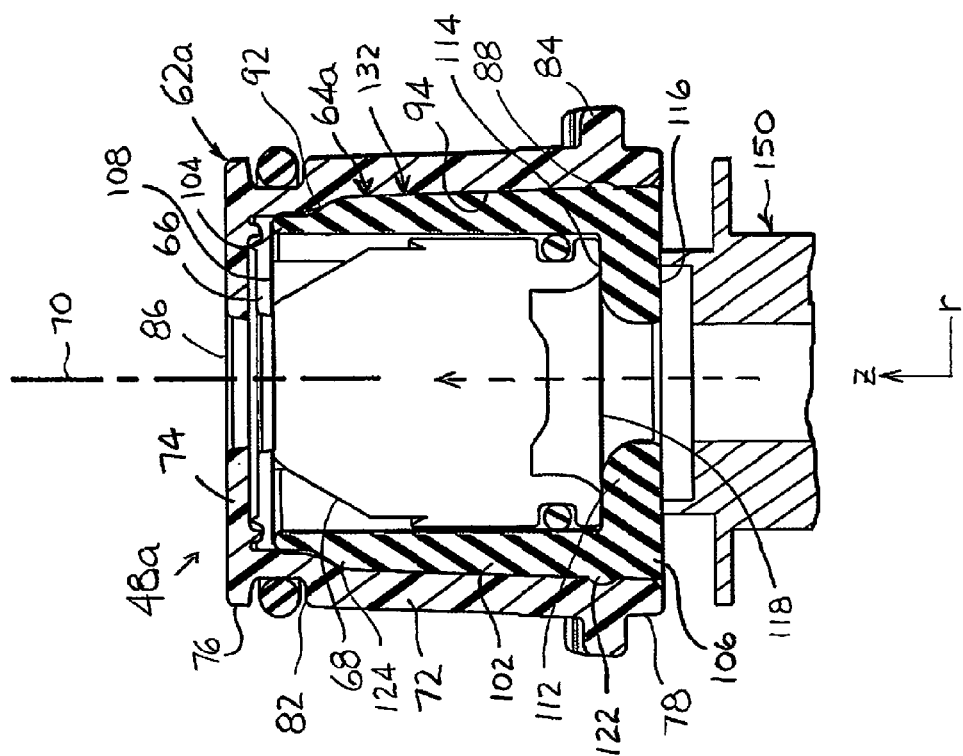

Referring to FIGS. 4 and 5, examples of an inlet breather assembly 48a and an outlet breather assembly 46a, respectively, are depicted in embodiments of the disclosure. Both breather assemblies 46a and 48a can include a body 62a, a "solid compliant" grommet or sealing member 64a, a filter assembly 66, and a check valve 68, all concentric about a central axis 70. The body 62a can include a substantially cylindrical or frustro-conical side wall 72 and a cap portion 74 at a proximal (top) end 76 and an open distal (bottom) end 78. In one embodiment, an O-ring groove 82 is defined near the proximal end 76 and a flange portion 84 near the distal end 78. The cap portion 74 can define a central aperture 86 of reduced diameter. An undercut 88 can be defined proximate the distal end 78. The body 62a can be made of a resilient material. In one embodiment, a radial inset 92 can be formed on an interior surface 94 of the body 62a.

For purposes of this disclosure, a "proximal" direction (designated by arrow 96 in FIG. 2) is defined as being in a direction going towards the interior of the substrate container 20, and a "distal" direction (designated by arrow 98 in FIG. 2) is defined as being in a direction going away from the interior of the substrate container 20.

The solid compliant grommet 64a can include a tubular portion 102 that is generally cylindrical or frustro-conical and includes a top or proximal end 104 and a bottom or distal end 106. The proximal end 104 can define an opening 108. In one embodiment, an annular disk portion 112 extends radially inward from the distal end 106, the annular disk portion 112 including an interior or proximal face 114, and an exterior or distal face 116 also referred to as a mounting face. The tubular portion 102 can define an inner diameter D1 (FIG. 5) near the distal end 106 at the annular disk portion 112. The annular disk portion 112 defines a central aperture 118 which can be circular with a diameter D2 (FIG. 5) that is less than diameter D1. The solid compliant grommet 64a can include a rib 122 for mating with the undercut 88 of the body 62a of the breather assembly 46a or 48a. In some embodiments, the tubular portion 102 of the solid compliant grommet 64a includes a shoulder portion 124 near the proximal end 104 that complements the radial inset 92 of the body 62a of the breather assembly 46a, 48a.

In assembly, the check valve 68 is inserted into the solid compliant grommet 64a through the opening 108 to form a subassembly 132. The subassembly 132 is then inserted into the open distal end 78 of the body 62a. The filter assembly 66 can be disposed between the cap portion 74 of the body 62a and the proximal end 104 of the solid compliant grommet 64a. The solid compliant grommet 64a is inserted into the body 62a until the rib 122 of the solid compliant grommet 64a engages with the undercut 88 of the body 62a. The solid compliant grommet 64a can thereby be secured to the body 62a. In one embodiment, the shoulder portion 124 of the grommet 64a is seated against the radial inset 92 of the body 62a to provide additional support for the coupling between the body 62a and the grommet 64a. The filter assembly 66 can be securely mated to the cap portion 74 of the body 62a.

Whether the breather assembly is an inlet breather assembly 48a or an outlet breather assembly 46a depends solely on the orientation of the check valve 68. If the check valve 68 is oriented to enable flow into the substrate container 20 (i.e., upwards in FIGS. 4 and 5), the breather assembly is an inlet breather assembly 48a; if the check valve 68 is oriented to enable flow out of the substrate container 20 (i.e., downwards in FIGS. 4 and 5), the breather assembly is an outlet breather assembly 46a.

Figure 6:
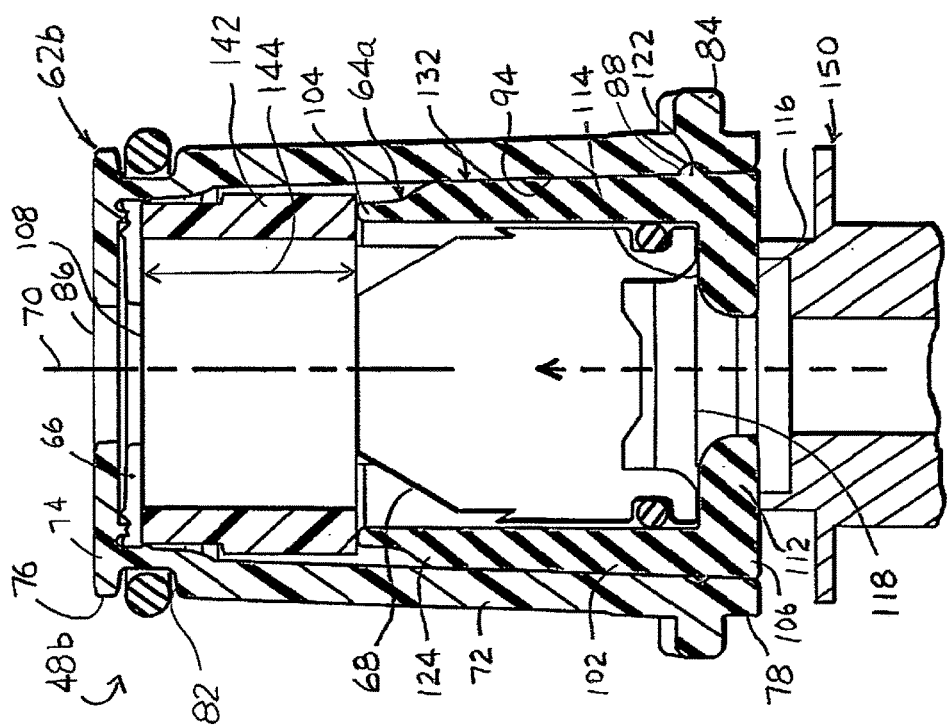
FIG. 6 is a sectional view of a breather assembly and a tool port, with a rear inlet valve utilizing a solid compliant construction in an embodiment of the disclosure.

Referring to FIG. 6, an inlet breather assembly 48b is depicted in an embodiment of the disclosure. The inlet breather assembly 48b has many of the same components and aspects as the breather assembly 46a, which are indicated with same-numbered numerical references. Note that the body 62b of the second breather assembly 48b is longer than the body 62 of the breather assembly 46a in order to accommodate the increased thickness of the floor structure 26 proximate the rear port 24 of the depicted substrate container 20 (FIG. 3). The solid compliant grommet 64a, check valve 68 and filter assembly 66 can be of identical construction as in the breather assembly 46a. In the depicted embodiment, a spacer 142 is inserted between the proximal end 104 of the solid compliant grommet 64a and the filter assembly 66 to make up for an internal height difference 144 between the proximal end 104 of the grommet 64a and the filter assembly 66. The use of the spacer 142 enables the same subassembly 132 to be implemented in the longer body 62b as in the body 62a, and also provides added security that the subassembly 132 will not become dislodged due to an excessive upwards force on the subassembly 132.

Figure 7:
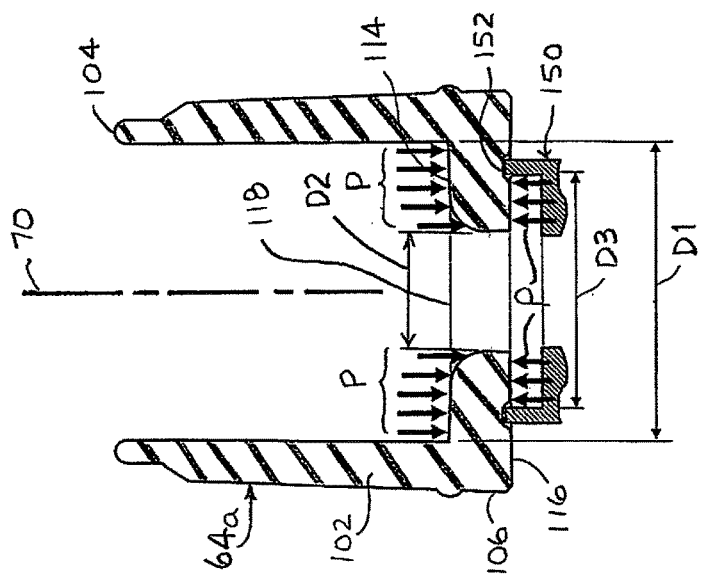
FIG. 7 is a sectional view of a solid compliant sealing member in isolation engaged with a tool port in an embodiment of the disclosure.

Referring to FIG. 7, the coupling operation between a tool port 150 and the solid compliant grommet 64a is depicted in a disclosed embodiment. The tool port 150 includes an inner diameter D3 that is brought into contact with the solid compliant grommet 64a. The contact can cause a depression 152 to temporarily form on the distal face 116 of the solid compliant grommet 64a. That is, the solid compliant construction complies (e.g., deforms or indents) locally to help affect a seal between the tool port 150 and the breather assembly 46a, 48a. In one embodiment, the grommet 64a is sized so that the inner diameter D3 of the tool port 150 is greater than the inner diameter D2 of the central aperture 118 of the annular disk portion 112 but less than the inner diameter D1 of the distal end 106 of the tubular portion 102.

The dynamics of the various breather assemblies, referred to collectively as breather assemblies 46 and 48, are depicted for embodiments of the disclosure. Note that, for the breather assemblies 46 and 48, an inner diameter D3 of the tool port 150 is less than the inner diameter D1 of the distal end 106 of the tubular portion 102 of the grommet 64a. Also, when the check valve 68 is open, the pressure P within the tool port 150 and the breather assembly 46 or 48 is essentially equal and is greater than the ambient pressure, whether the breather assembly 46, 48 is in an exhaust or an intake configuration. Accordingly, because inner diameter D1 of the distal end 106 of the tubular portion 102 is greater than inner diameter D3 of the interior of the tool port, and because the pressures exerted within these diameters are essentially equal, a greater force (pressure-area product) is exerted on the proximal face 114 of the flexible annular disk portion 112 than is exerted on the distal face 116 annular disk portion 112. Therefore, the net force vector exerted on the annular disk portion 112 is in the direction of the tool port 150 (i.e., downward in the depictions of FIGS. 4 through 6). The net force can cause the solid compliant grommet 64a to be biased slightly downward and seat against the tool port 150 with more efficacy, thereby augmenting a seal between the distal face 116 of the solid compliant grommet 64a and the tool port 150.

Formation of the depression 152 is enabled by a combination of material hardness and the thickness of the annular disk portion 112 of the solid compliant grommet 64a. The so-called "solid compliant" grommet 64a is made of a compliant material, but is of a thickness that maintains the general shape of the annular disk portion 112 and/or tubular portion 102 under contact loads of operation.

Figure 8A:
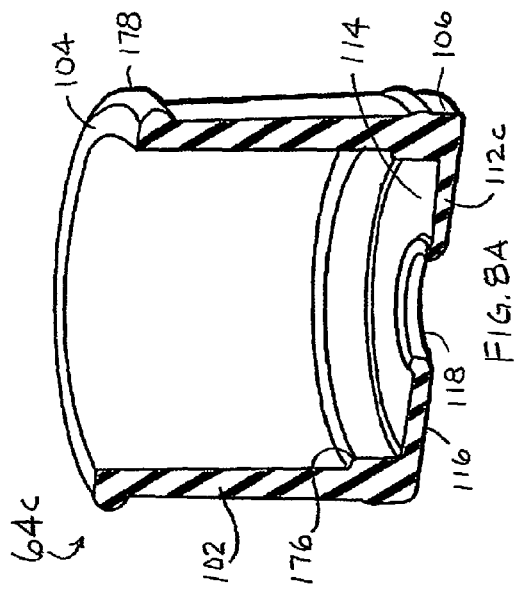
FIG. 8A is a perspective sectional view of the flexible compliant sealing member of FIG. 8 in isolation.
Figure 8B:
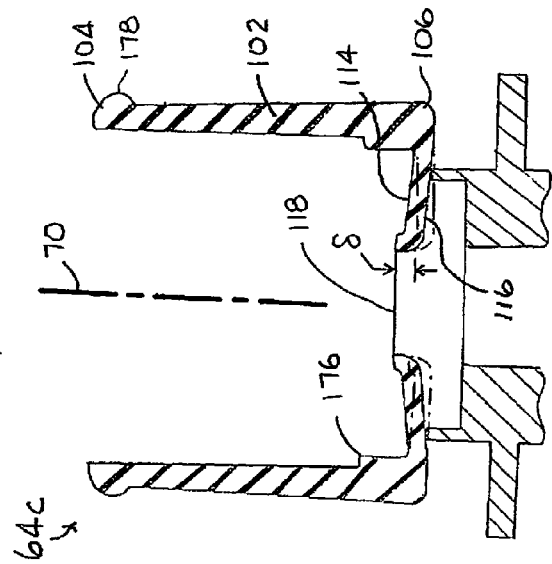
FIG. 8B is a sectional view of the flexible compliant sealing member in isolation engaged with the tool port of FIG. 8.
Figure 8:
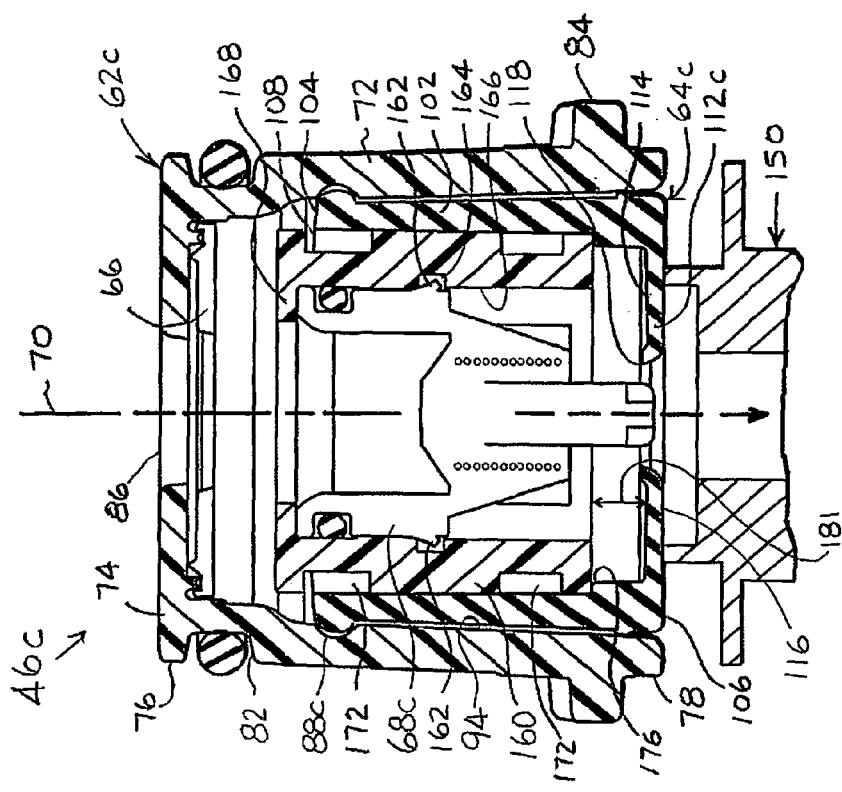
FIG. 8 is a sectional view of a breather assembly and a tool port, utilizing a flexible compliant sealing member in an embodiment of the disclosure.

Referring to FIG. 8, a breather assembly 46c is depicted in an embodiment of the disclosure. The breather assembly 46c includes many of the same aspects as the breather assembly 48a, which are indicated with same-numbered numerical references. Some aspects of the breather assembly 46c that differ from breather assembly 48a are identified by the same numerical prefix, followed by the suffix "c".

The body 62c differs from the body 62a in that the undercut 88c is located near the proximal end 76 of the body 62c instead of near the distal end 78. In one embodiment, the check valve 68c is housed in a check valve housing 160. The check valve 68c can include exterior snaps 162 that snap into an interior recess 164 formed on an interior surface 166 of the check valve housing 160. The check valve housing 160 can also include an annular flange 168 that retains the check valve 68c in place once the exterior snaps 162 engage with the interior recess 164 of the check valve housing 160. The check valve housing 160 can also include exterior recesses 172 formed on the outer surface.

Referring to FIGS. 8A and 8B, a grommet 64c of breather assembly 46c is depicted in an embodiment of the disclosure. The annular disk portion 112c of the grommet 64c is of a "flexible compliant" construction rather than the "solid compliant" construction of breather assembly 48a. The difference between a "flexible compliant" construction and the previously discussed "solid compliant" construction is that a flexible compliant device does not maintain its general shape under load. Rather, the flexible compliant construction is of generally thinner wall thicknesses, which enables the device to deform and take on a noticeably different shape under load.

Accordingly, when the flexible annular disk portion 112c of the flexible compliant grommet 64c is in deflecting contact with the load port 150, the central aperture 118 of the flexible annular disk portion 112c experiences an axial deflection δ that is in the proximal direction 96, is relative to the distal end 106 of the tubular portion 102 of the grommet 64c, and is directly proportional to the extent that the load port 150 displaces the flexible annular disk portion 112c.

The flexible compliant grommet 64c can also include an interior ledge portion 176 proximate the distal end 106 of the tubular portion 102, and an exterior lip portion 178 at or near the proximal end 104 of the grommet 64c for mating with the undercut 88c. The distal face 116 of the flexible annular disk portion 112c can be substantially planar in a non-deflected state.

For purposes of this disclosure, the grommet 64a is considered "solid compliant" if, under contact load with the port 150, the axial depth of the depression 152 on the distal face 116 of annular disk portion 112 is greater than the axial deflection δ of the central aperture 118 of the annular disk portion 112. In contrast, the grommet 64c is considered "flexible compliant" if, under contact load with the port 150, the axial depth of the depression 152 is less than or equal to the axial deflection δ of the central aperture 118 of the annular disk portion 112.

For the annular disk 112, the axial deflection δ is generally described by the following equation:

$$\delta = \frac{3(m-1)(7m+3)PR^2}{16\pi Em^2 t^3} \qquad \text{Eq. (1)}$$

where E is the elastic modulus of the material of the annular disk portion, P is the load force, R is the radius of the annular disk portion, t is the axial thickness of the annular disk portion, and 1/m is the Poisson's ratio of the material of the annular disk portion. Inspection of Eq. (1) reveals that, for a material of given E and m, the force required to generate a given δ is diminished for increased radius R and decreased thickness t. generate a given δ is diminished for increased radius R and decreased thickness t. Accordingly, for flexible compliant grommets such as grommet 64c, improved shape compliance with and reduced force loads on the port 150 is realized by increasing the inner diameter D1 and reducing the axial thickness t of the annular disk 112.

Another parameter for consideration in the solid compliant and flexible compliant grommets is the hardness of the annular disk 112. We have found that a material hardness in the range of 40 to 70 shore A hardness inclusive is suitable for a solid compliant construction. An example of a material that enables "solid compliant" construction is a thermoplastic polyester elastomer such as HYTREL 3078 or ARNITEL EM400. We have also found that a material hardness in the range of 20 to 40 shore D hardness inclusive is suitable for flexible compliant construction. It is understood that the above-stated hardness values and materials are representative and non-limiting.

Figure 9:
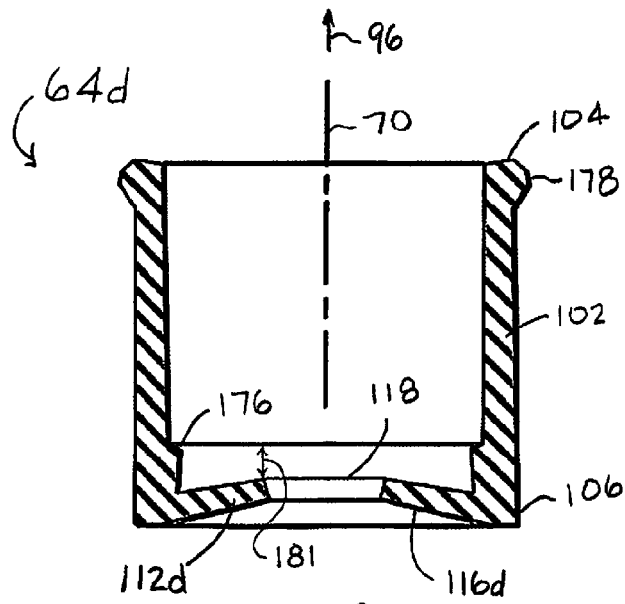
FIG. 9 is a sectional view of a flexible compliant sealing member in an embodiment of the disclosure.

Referring to FIG. 9, a flexible complaint grommet 64d is depicted in an embodiment of the disclosure. The flexible complaint grommet 64d includes many of the same aspects as the other grommets 64, which are indicated with like-numbered numerical references. Aspects unique to the flexible compliant grommet 64d are indicated by a "d" suffix.

One such unique aspect is that an annular disk portion 112d includes a distal face 116d that defines a concave geometry. More specifically, the annular disk portion 112d is sloped upward (i.e., in the proximal direction 96) and towards the central axis 70 of the grommet 64d, thus providing concave face relative to the tool port 150 when the grommet 64d is in an non-deflected state.

Figure 10:
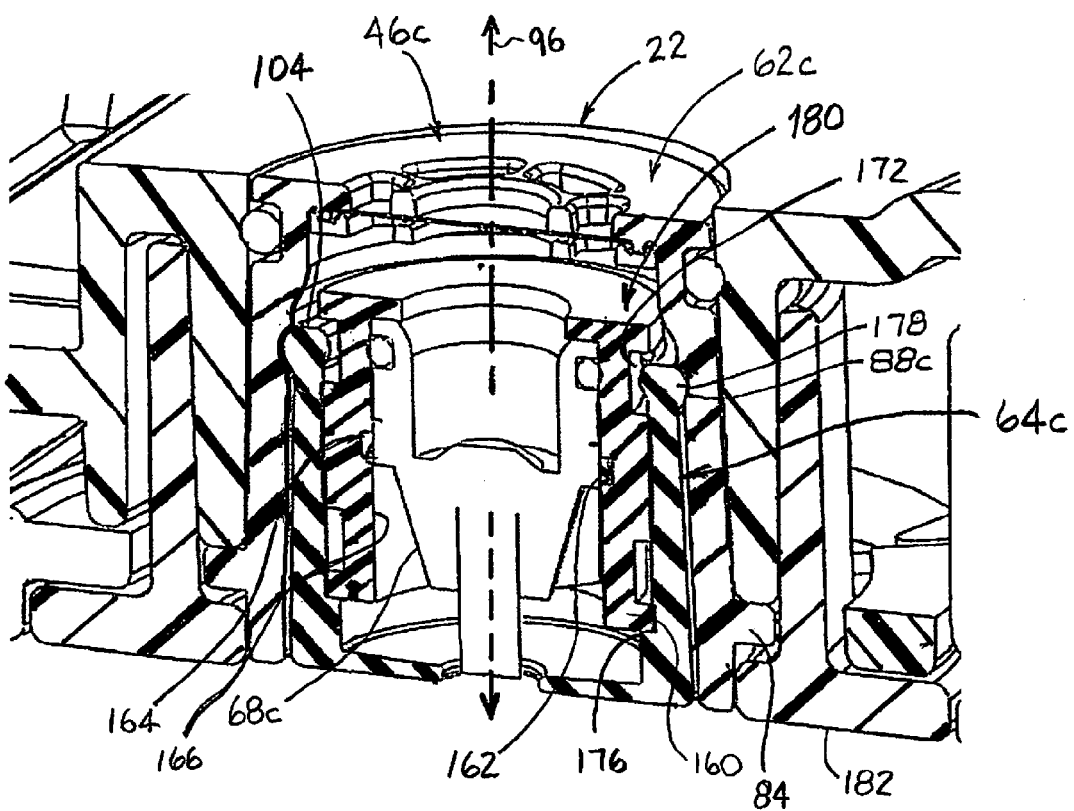
FIG. 10 is cutaway sectional view of the breather assembly of FIG. 8 in a substrate carrier port in an embodiment of the disclosure.

Referring to FIG. 10, the breather assembly 46c is depicted in assembly in an embodiment of the disclosure. To assemble, the check valve 68c is slid into the check valve housing 160 until the exterior snaps 162 engage with the interior recess 164 on the interior surface 166 of the check valve housing 160 to form a check valve/check valve housing subassembly 180. The check valve/check valve housing subassembly 180 is then slid into the open (proximal) end 104 of the flexible compliant grommet 64c until it registers on the interior ledge portion 176 of the grommet 64c. The flexible compliant grommet 64c with the check valve/check valve housing subassembly 180 disposed therein is then inserted into the body 62c until the exterior lip portion 178 of the flexible compliant grommet 64c engages with the undercut 88c of the body. The breather assembly 46c is then disposed in a port of the substrate container 20 (e.g., port 22) and retained therein, for example, by a threaded fixture 182 that engages the flange portion 84 of the body 62c.

The exterior lip portion 178 of the flexible compliant grommet 64c can be dimensioned such that, when engaged with the undercut 88c, the proximal end 104 of the grommet 64c is deformed slightly radially inward and slightly into the exterior recess 172 of the check valve housing 160, the exterior recess 172 being located to align with the proximal end 104 of the flexible compliant grommet 64c when the check valve housing 160 is registered on the interior ledge portion 176 of the grommet 64c. The radial inward deformation into the exterior recess 172 can assist in retaining the check valve/check valve housing assembly 180.

The same assembly procedure can be performed using the flexible compliant grommet 64d instead of the flexible compliant grommet 64c.

In operation, the tool port 150 is brought into contact with the flexible compliant grommet 64c (or 64d). The flexible annular disk portion 112c (or 112d) of the flexible compliant grommet 64c, 64d complies by deforming to conform to the mouth of the port 150, causing the central aperture 118 of the flexible annular disk portion 112c, 112d to deflect in the proximal direction 96. The ledge portion 176 maintains a separation 181 between the check valve/check valve housing subassembly 180 and the annular disk portion 112c, 112d, enabling the annular disk portion 112d to flex in the proximal direction 96.

The dynamics of the pressure-area products cause annular disk portion 112c, 112d to be exerted against the mouth of the tool port 150, as explained above attendant to FIG. 7, thereby helping affect a seal between the tool port 150 and the flexible compliant grommet 64c, 64d. The deflective capability of the annular disk portion 112c, 112d can augment conformation of the annular disk portion 112c, 112d to the mouth of the tool port 150 for an enhanced sealing effect.

Functionally, for the flexible compliant grommets 64c, 64d, the utilization of either the planar distal face 116 or the concave distal face 116d further facilitates the sealing action between the grommets 64c, 64d and the tool port 150. The deflection δ of the annular disk portion 112c, 112d in the proximal direction 96 can cause the annular disk portion 112c, 112d to stretch relative to a neutral or stress-free position. The stretching can cause a constriction about the mouth of the tool port 150, thereby enhancing the seal therebetween.

Figure 11:
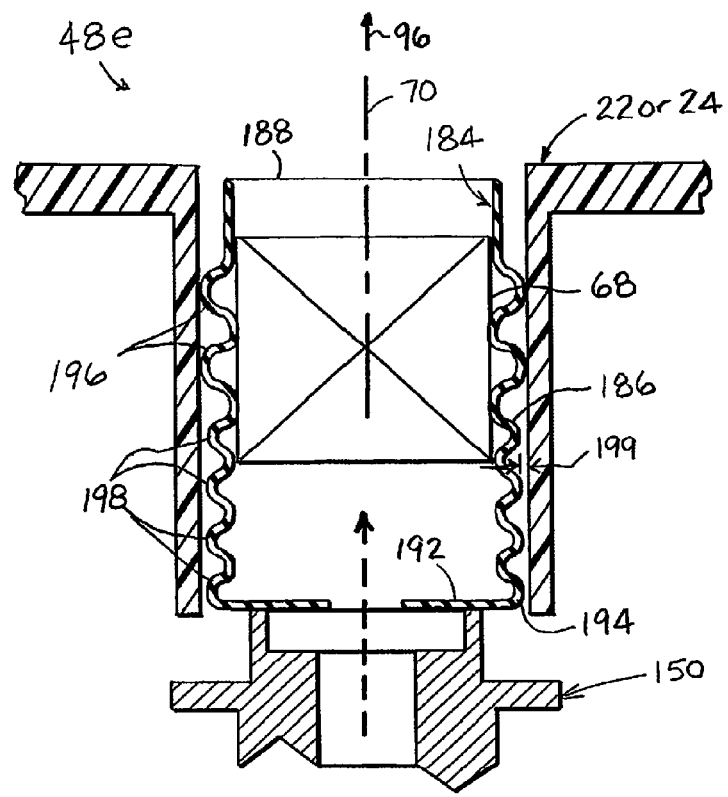
FIG. 11 is a sectional view of a breather assembly having a bellows grommet of flexible compliant construction in an embodiment of the disclosure.

Referring to FIG. 11, a breather assembly 48e is depicted in an embodiment of the disclosure. The breather assembly 48e includes a bellows grommet 184 of a flexible compliant construction. The bellows grommet 184 comprises a bellows portion 186 having an open proximal end 188 and an annular disk portion 192 at a distal end 194. The check valve 68 is disposed in the bellows grommet 184 proximate the proximal end 188. The bellows portion 186 can be constructed so that a plurality of ribs 196 near the proximal end 188 are of larger outer diameter than a plurality of ribs 198 that are near the distal end 194 of the bellows. The inner diameter of the larger diameter ribs 196 and the check valve 68 are dimensioned to provide an interference fit therebetween.

In assembly, the check valve 68 is press fit into the open proximal end 188, causing a friction fit between the bellows 196 and the check valve 68. As in the other breather assembly valves, the orientation of the check valve determines whether the breather assembly facilitates exhaust or intake. The bellows/check valve assembly is then press fit into the purge port 22, 24 of the substrate container 20. The larger diameter ribs 196 near the open proximal end 188 frictionally engage the inner wall of the purge port 22, 24 to secure the bellows/check valve assembly within the purge port 22, 24. Meanwhile, there is clearance 199 between the smaller diameter ribs 198 and the inner wall of the purge port 22, 24, enabling compression of the bellows 198 to be compressed axially without interference from the purge port 22, 24.

In operation, the tool port is brought into contact with the bellows grommet 184. The flexible annular disk portion 192 of the bellows grommet 184 complies by deforming the bellows portion 184 axially. The compression of the bellows portion 186 can exert a biasing force that facilitates a seal between the flexible annular disk portion 192 of the bellows grommet 184 and the tool port 150. In one embodiment, a spring (not depicted) can be coupled to the bellows 196 to enhance the biasing force. Also, the larger area of the flexible annular disk portion 192 relative to the inner diameter D3 of the port 150, and the resulting supplemental sealing force realized thereby (described in connection with FIG. 8 above) can also be present with the bellows grommet 184.

Figure 12:
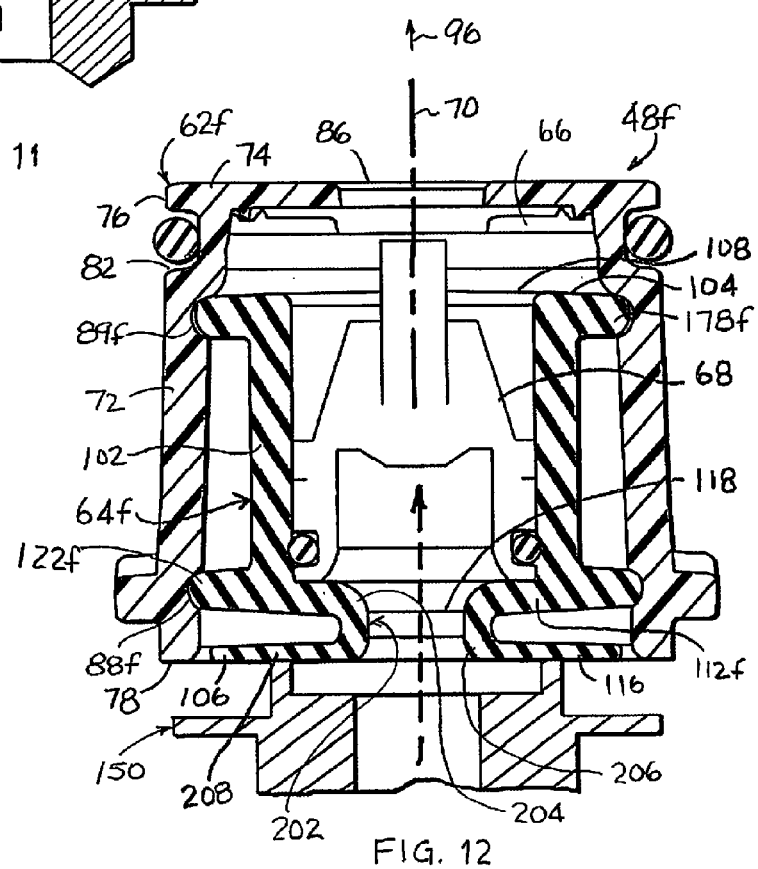
FIG. 12 is a sectional view of a breather assembly having a flexible compliant sealing member in an embodiment of the disclosure.

Referring to FIG. 12, a breather assembly 48f is depicted in an embodiment of the disclosure. The breather assembly 48f includes many of the same aspects as the breather assembly 48a, which are indicated with same-numbered numerical references. Certain unique aspects of the breather assembly 48f are identified by the same numerical prefix, followed by the suffix "f".

The breather assembly 48f can include a body 62f having two undercuts 88f and 89f—the undercut 88f being near the distal end 78 and the undercut 89f being near the cap portion 74 of the body 62f.

The breather assembly 48f includes a flexible compliant grommet 64f. The flexible compliant grommet 64f can be characterized as having an annular disk portion 112f and an orifice structure 202 that depends from the annular disk portion 112f and surrounds the central aperture 118. The orifice structure 202 can be characterized as having a proximal end 204 integral with the annular disk portion 112f and a distal end 206. In one embodiment, a second annular disk portion 208 extends radially outward from the distal end 206 of the orifice structure 202. The flexible compliant grommet 64f can also include a rib portion 122f and a lip portion 178f that cooperate with the undercuts 89f and 88f of the body 62f, respectively, to retain the flexible compliant grommet 64f within the body 62f. The distal face 116 of the second annular disk portion can be substantially planar (as depicted) or define a concave contour.

In assembly, the check valve 68 is pressed into the flexible compliant grommet 64f and can be retained therein by friction. The grommet 64f is inserted directly into the body 62f until the rib portion 122f and the lip portion 178f engage the respective undercuts 89f and 88f.

In operation, the tool port 150 is brought into contact with the flexible compliant grommet 64f. The lower annular disk portion 202 of the flexible compliant grommet 64f complies by deforming to conform to the mouth of the tool port 150.

Figure 13:
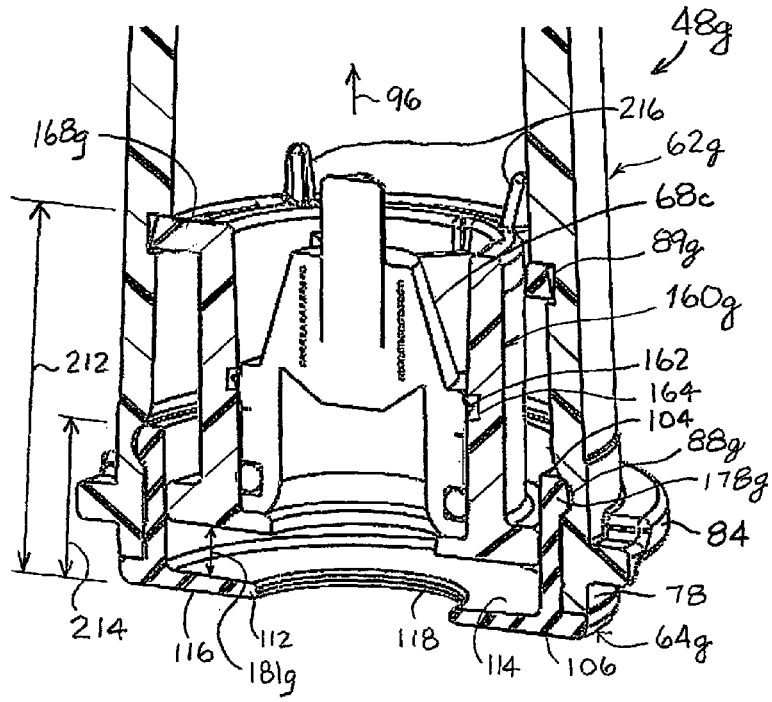
FIG. 13 is a perspective sectional view of a breather assembly with a check valve housing engaged directly to the body in an embodiment of the disclosure.
Figure 13A:
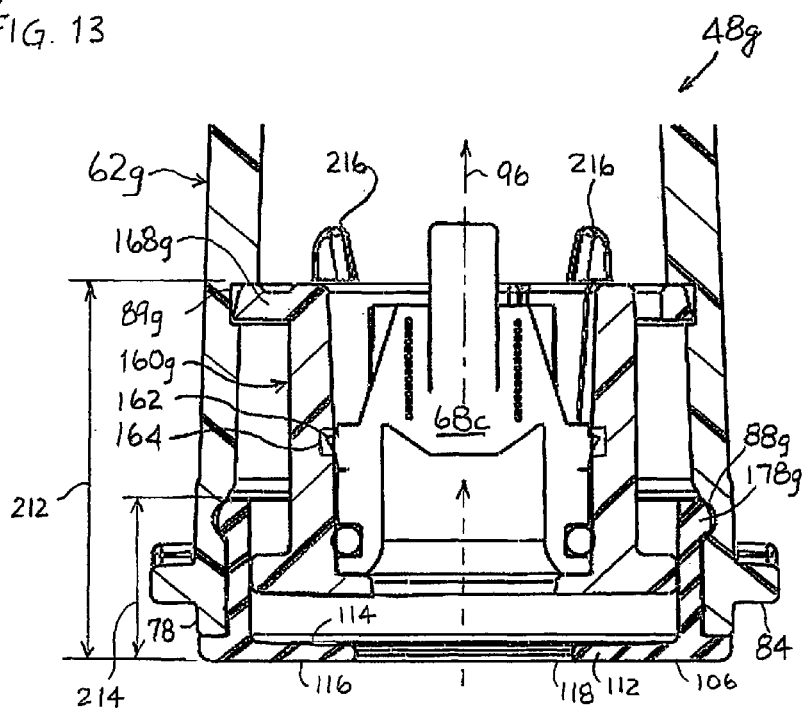
FIG. 13A is a sectional view of the breather assembly of FIG. 13.

Referring to FIGS. 13 and 13A, a breather assembly 48g is depicted in an embodiment of the disclosure. The breather assembly 48g includes many of the same aspects as the breather assemblies 48a and 46c, which are indicated with same-numbered numerical references. Certain unique aspects of the breather assembly 48g are identified by the same numerical prefix, followed by the suffix "g".

The breather assembly 48g includes a check valve housing 160g disposed in a grommet 64g, all housed within a body 62g. In the depicted embodiment, the check valve housing 160g is characterized as having an axial length 212 that is greater than an axial length 214 of the grommet 64g. The body 62g includes a first undercut 88g near the distal end 78 that mates with the lip portion 178g of the grommet 64g for securing the grommet 64g within the body 62g. A second undercut 89g is located proximal to the undercut 88g. The check valve housing 160g includes an annular flange 168g at or near the proximal end, the annular flange 168g being positioned and dimensioned to mate with the second undercut 89g. In one embodiment, a plurality of gusset protrusions 216 extend from the interior surface 94 of the body 62g to assure that the annular flange 168 remains captured within the second undercut 89g.

Functionally, the check valve housing 160g mates directly with the body 62g, thereby maintaining a separation 181g between the check valve 68c/check valve housing 160g and the annular disk 112g. There is no need for the grommet 64g to include an interior ledge portion (e.g., item 176 of breather assembly 46c) to accomplish the separation. In this way, the anchor point of the annular disk 112g to the tubular portion 102 of the grommet 64g is moved radially outward, effectively increasing the radius R of the annular disk 112g relative to that of annular disk 112c (FIG. 8). For flexible compliant designs, the increase in R also increases the flexibility of the annular disk 112g, as discussed above in relation to Eq. (1).

Figure 14:
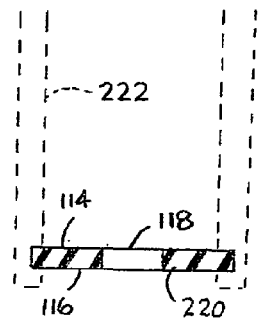
FIG. 14 is a schematic of an annular disk in an embodiment of the disclosure.

Referring to FIG. 14, a sectional view of an annular disk 220 is depicted in an embodiment of the disclosure. The annular disk includes many of the same aspects as the various annular disk portions 112 disclosed above, such as the proximal face 114, the distal face 116 and the central aperture 118. The various embodiments disclosed above depict annular disk portions 112 as being an integrally formed portion of a larger grommet or sealing member. It is understood that an annular disk 220 that is not integrally formed with a larger grommet is also contemplated. Generally, the annular disk 220 can be mounted in a support structure 222 that is adapted for insertion into, for example, the purge ports 22 and 24 of the substrate carrier 20. The support structure can be made of any suitable material, such as a resilient polymer or a metal. The annular disk 220 can be coupled to the support structure by various mechanisms available to the artisan, including slot mounting, capture between threaded components, adhesion, and overmolding.

References to relative terms such as upper and lower, top and bottom, front and back, left and right, horizontal, or the like, are intended for convenience of description and are not contemplated to limit the invention, or its components, to any one positional or special orientation, unless otherwise explicitly stated. All dimensions depicted in the figures can vary with a potential design and the intended use of a specific embodiment of this invention without departing from the scope thereof.

Each of the additional figures and methods disclosed herein can be used separately, or in conjunction with other features and methods, to provide improved containers and methods for making and using the same. Therefore, combinations of features and methods disclosed herein may not be necessary to practice the invention in its broadest sense and are instead disclosed merely to particularly describe representative and preferred embodiments of the instant invention.

Various modifications to the embodiments of the inventions may be apparent to one of skill in the art upon reading this disclosure. For example, persons of ordinary skill in the relevant art will recognize that the various features described for the different embodiments of the inventions can be suitably combined, un-combined, and re-combined with other features, alone, or in different combinations, within the spirit of the invention. Likewise, the various features described above should all be regarded as example embodiments, rather than limitations to the scope or spirit of the inventions. Therefore, the above is not contemplated to limit the scope of the inventions.

Persons of ordinary skill in the relevant arts will recognize that the inventions may comprise fewer features than illustrated in any individual embodiment described above. The embodiments described herein are not meant to be an exhaustive presentation of the ways in which the various features of the inventions may be combined.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

References to "embodiment(s)", "embodiment(s) of the disclosure", and "disclosed embodiment(s)" contained herein refer to the specification (text, including the claims, and figures) of this patent application that are not admitted prior art.

For purposes of interpreting the claims for the embodiments of the inventions, it is expressly intended that the provisions of 35 U.S.C. 112(f) are not to be invoked unless the specific terms "means for" or "step for" are recited in a claim.

What is claimed is:

1. A substrate container that defines an interior chamber, the substrate container comprising:
   a port for passage of a purge gas into or out of said interior chamber;
   a breather assembly disposed in said port, said breather assembly including:
   a body; and
   a grommet disposed in said body, said grommet including a tubular portion and an annular disk portion, said tubular portion having an inner diameter at a distal end, said annular disk portion extending radially inward from said tubular portion and being proximate said distal end of said tubular portion, said annular disk portion defining a central aperture having an inner diameter, said inner diameter of said aperture being less than said inner diameter of said distal end of said tubular portion, said annular disk portion presenting a distal face of said grommet,
   wherein said distal face of said grommet presents one of a planar geometry and a concave geometry, said distal face being adapted to contact a tool port that has an inner diameter that is greater than said inner diameter of said aperture and less than said inner diameter of said distal end of said tubular portion, said annular disk portion of said grommet being of a compliant material for formation of a seal between said tool port and said distal face of said grommet.

2. The substrate container of claim 1, further comprising a check valve disposed in said grommet.

3. The substrate container of claim 2, wherein said grommet further comprises an interior ledge portion for registration of said check valve to separate said check valve from said annular disk portion.

4. The substrate container of claim 1, wherein said grommet is a flexible compliant grommet.

5. The substrate container of claim 4, wherein said compliant material has a shore D hardness greater than or equal to 20 and less than or equal to 40.

6. The substrate container of claim 1, wherein said grommet is a solid compliant grommet with a shore A hardness greater than or equal to 40 and less than or equal to 70.

7. The substrate container of claim 1, wherein:
   said body includes an interior surface and structure defining an undercut on said interior surface; and
   said grommet includes one of a rib and a lip dimensioned and positioned to mate with said undercut when said grommet is disposed in said body.

8. The substrate container of claim 1, wherein said tubular portion of said grommet comprises a bellows.

9. The substrate container of claim 1, wherein said tubular portion and said annular disk portion are an integrally formed component.

10. A breather assembly for a substrate container, comprising:
    a support structure adapted for insertion into a purge port of a substrate container, said support structure defining an inner diameter; and
    an annular disk coupled with said support structure proximate said inner diameter, said annular disk including a proximal face and a distal face and including structure that defines a central aperture having a diameter,
    wherein said distal face of said annular disk presents one of a planar geometry and a concave geometry, said distal face being ada$_p$ted to contact a tool pOrt that has an inner diameter that is greater than said diameter of said aperture and less than said inner diameter of said support structure, said annular disk comprising a compliant material for formation of a seal between said tool port and said distal face of said grommet.

11. The breather assembly of claim 10, wherein said support structure and said annular disk are an integrally formed component.

12. The breather assembly of claim 10, wherein said annular disk is a solid compliant structure.

13. The breather assembly of claim 10, wherein said annular disk is an overmolded component.

14. The breather assembly of claim 10, wherein said support structure includes a tubular portion, said tubular portion having an inner diameter at a distal end, said annular disk extending radially inward and being proximate said distal end of said tubular portion, said inner diameter of said distal end of said tubular portion being greater than said diameter of said central aperture.

15. The breather assembly of claim 14, wherein said tubular portion includes an interior ledge portion proximate said distal end of said tubular portion.

16. The breather assembly of claim 14, wherein said tubular portion comprises a resilient material.

17. The breather assembly of claim 14, further comprising a check valve disposed in said tubular portion of said support structure.

18. The breather assembly of claim 17, wherein said check valve is disposed in a check valve housing, said check valve housing being disposed in said tubular portion of said support structure.

19. A substrate container that defines an interior chamber, the substrate container comprising:
   a purge port for passage of a purge gas into or out of said interior chamber;
   a breather assembly disposed at said purge port, said breather assembly including:
   a grommet secured at said purge port by a body, said grommet comprising an annular disk portion, said annular disk portion extending radially inward and defusing a central aperture having an inner diameter, said annular disk portion anchored at said purge port radially outward from said central aperture and presenting a distal face of said annular disk portion,
   wherein said distal face of said annular disk portion presents one of a planar geometry and a concave geometry, said distal face for contacting a tool port that has a diameter that is greater than said inner diameter of said aperture and less than where said annular disk portion is anchored, said annular disk portion being of a compliant material and deflectable inwardly for formation of a seal between said tool port and said distal face of said annular disk portion, and
   a check valve positioned inwardly of the annular disk portion at the purge port.

20. A method for purging the substrate container of claim 19, said method comprising: providing a tool port for supply of a purge gas, said tool port including a mouth; providing the substrate container of claim 19 having the purge port, said purge port including the annular disk portion suspended therein, said annular disk portion being concentric about a central axis and adapted to engage said mouth of said tool port; translating said substrate carrier in a first direction that is parallel to said central axis, thereby bringing said annular disk portion into an initial contact with said mouth of said tool port; and causing said annular disk portion to stretch over said mouth of said tool port as said annular disk portion is further translated in said first direction beyond said initial contact.

* * * * *